United States Patent
Fukuda et al.

(10) Patent No.: US 7,078,862 B2
(45) Date of Patent: Jul. 18, 2006

(54) BEAM SOURCE AND BEAM PROCESSING APPARATUS

(75) Inventors: Akira Fukuda, Fujisawa (JP); Akio Shibata, Fujisawa (JP); Hirokuni Hiyama, Fujisawa (JP); Katsunori Ichiki, Fujisawa (JP); Kazuo Yamauchi, Fujisawa (JP); Seiji Samukawa, Sendai (JP)

(73) Assignees: Ebara Corporation, Tokyo (JP); Tohoku University, Sendai (JP)

( * ) Notice: Subject to any disclaimer, the term of this patent is extended or adjusted under 35 U.S.C. 154(b) by 35 days.

(21) Appl. No.: 10/797,596

(22) Filed: Mar. 11, 2004

(65) Prior Publication Data

US 2004/0221815 A1  Nov. 11, 2004

(30) Foreign Application Priority Data

Mar. 14, 2003 (JP) ............................. 2003-071071

(51) Int. Cl.
*H05B 31/26* (2006.01)
*C23C 16/00* (2006.01)

(52) U.S. Cl. ..................... 315/111.21; 315/111.31; 315/111.81; 118/723 I

(58) Field of Classification Search .......... 315/111.21, 315/111.31, 111.51, 111.81; 156/345.48, 156/345.39, 345.51; 118/723 I, 723 MW; 313/359.1, 363.1, 362.1; 250/251
See application file for complete search history.

(56) References Cited

U.S. PATENT DOCUMENTS 4,158,589 A    6/1979  Keller et al. ........... 156/345.46

(Continued)

FOREIGN PATENT DOCUMENTS

WO    WO 01/06534    1/2001

(Continued)

OTHER PUBLICATIONS

J.M.E. Harper et al., "Low Energy Ion Beam Etching", J. Electrochem. Soc: Solid-State Science and Technology, vol. 128, No. 5, May 1981, pp. 1077-1083.

(Continued)

*Primary Examiner*—Tuyet Vo
*Assistant Examiner*—Ephrem Alemu
(74) *Attorney, Agent, or Firm*—Westerman, Hattori, Daniels & Adrian, LLP.

(57) ABSTRACT

A beam source has a plasma generating chamber, an antenna for generating plasma in the plasma generating chamber, a first electrode disposed in the plasma generating chamber, and a second electrode disposed in the plasma generating chamber. Both of the antenna and the second electrode face the first electrode. The beam source also includes a power supply for applying a voltage between the first electrode and the second electrode to extract particles from the plasma generated by the antenna. The beam source applies various kinds of beams having a large diameter, such as a positive ion beam, a negative ion beam, and a neutral particle beam, uniformly to a workpiece.

26 Claims, 11 Drawing Sheets

U.S. PATENT DOCUMENTS

| | | | | |
|---|---|---|---|---|
| 5,818,040 | A | * | 10/1998 | Kinoshita et al. ............ 250/251 |
| 5,827,435 | A | | 10/1998 | Samukawa ............. 315/111.21 |
| 5,883,470 | A | * | 3/1999 | Hatakeyama et al. ... 315/111.51 |
| 5,928,528 | A | | 7/1999 | Kubota et al. ............ 118/723 E |
| 6,217,703 | B1 | | 4/2001 | Kitagawa ................ 156/345.33 |
| 6,291,357 | B1 | * | 9/2001 | Zhang et al. ........... 156/345.24 |
| 6,331,701 | B1 | | 12/2001 | Chen et al. .............. 315/111.81 |
| 6,512,333 | B1 | * | 1/2003 | Chen ...................... 315/111.21 |
| 6,814,814 | B1 | * | 11/2004 | Collins et al. .................. 134/1 |
| 6,861,642 | B1 | * | 3/2005 | Ichiki et al. ................. 250/251 |
| 6,861,643 | B1 | * | 3/2005 | Ichiki et al. ............ 156/345.39 |

FOREIGN PATENT DOCUMENTS

WO     WO 02/078407     10/2002

OTHER PUBLICATIONS

Harold R. Kaufman, "Technology of ion beam sources used in sputtering", J. Vac. Sci. Technol. 15(2), Mar./Apr. 1978, pp. 272-276.

Shoji Kitamura, "Ion Engine (Direct Current Discharge Type)", J. Vac. Soc. Jpn. vol. 45, No. 4, 2002, pp. 329-335.

* cited by examiner

F I G. 2
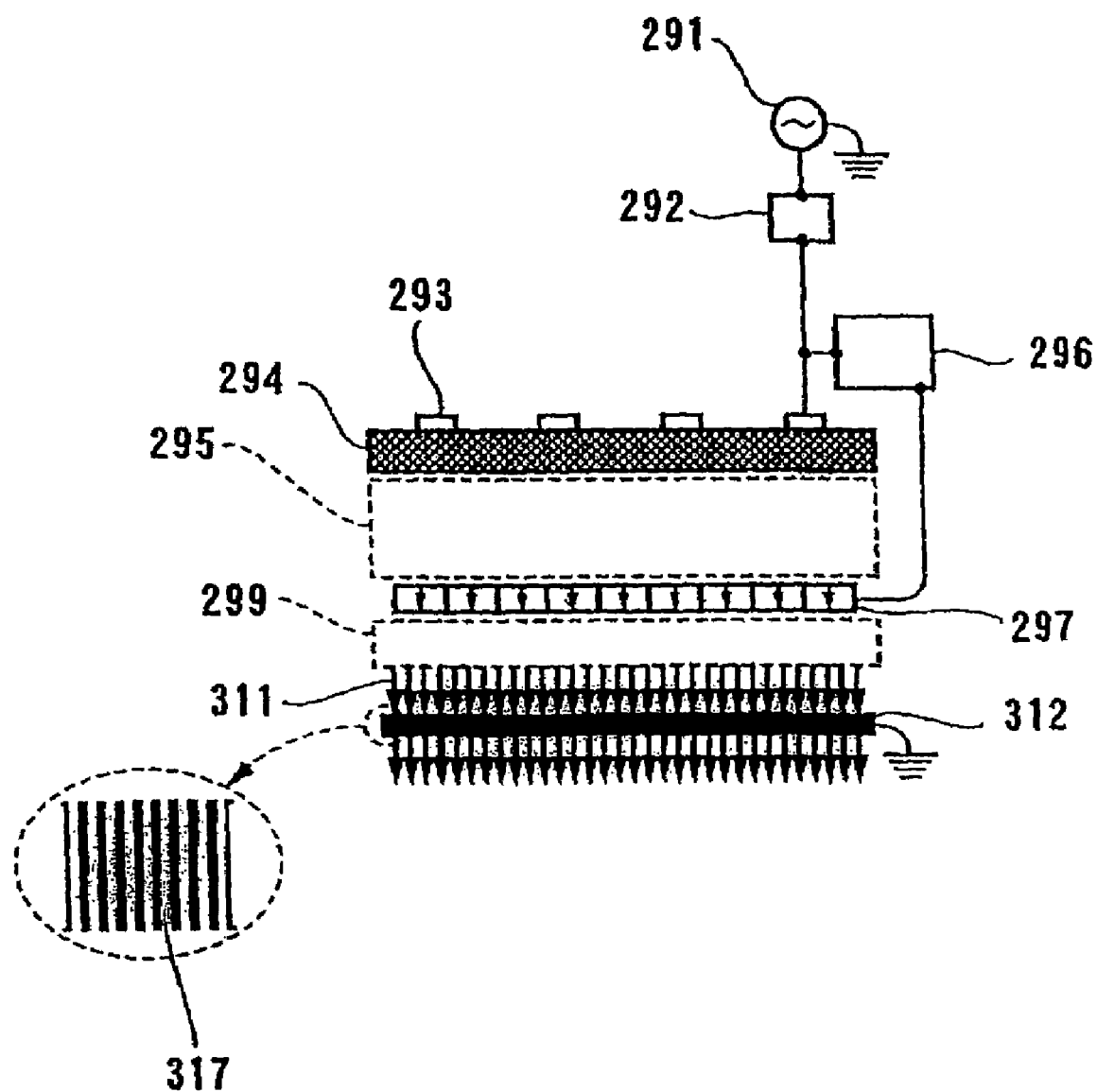

F I G. 1 5
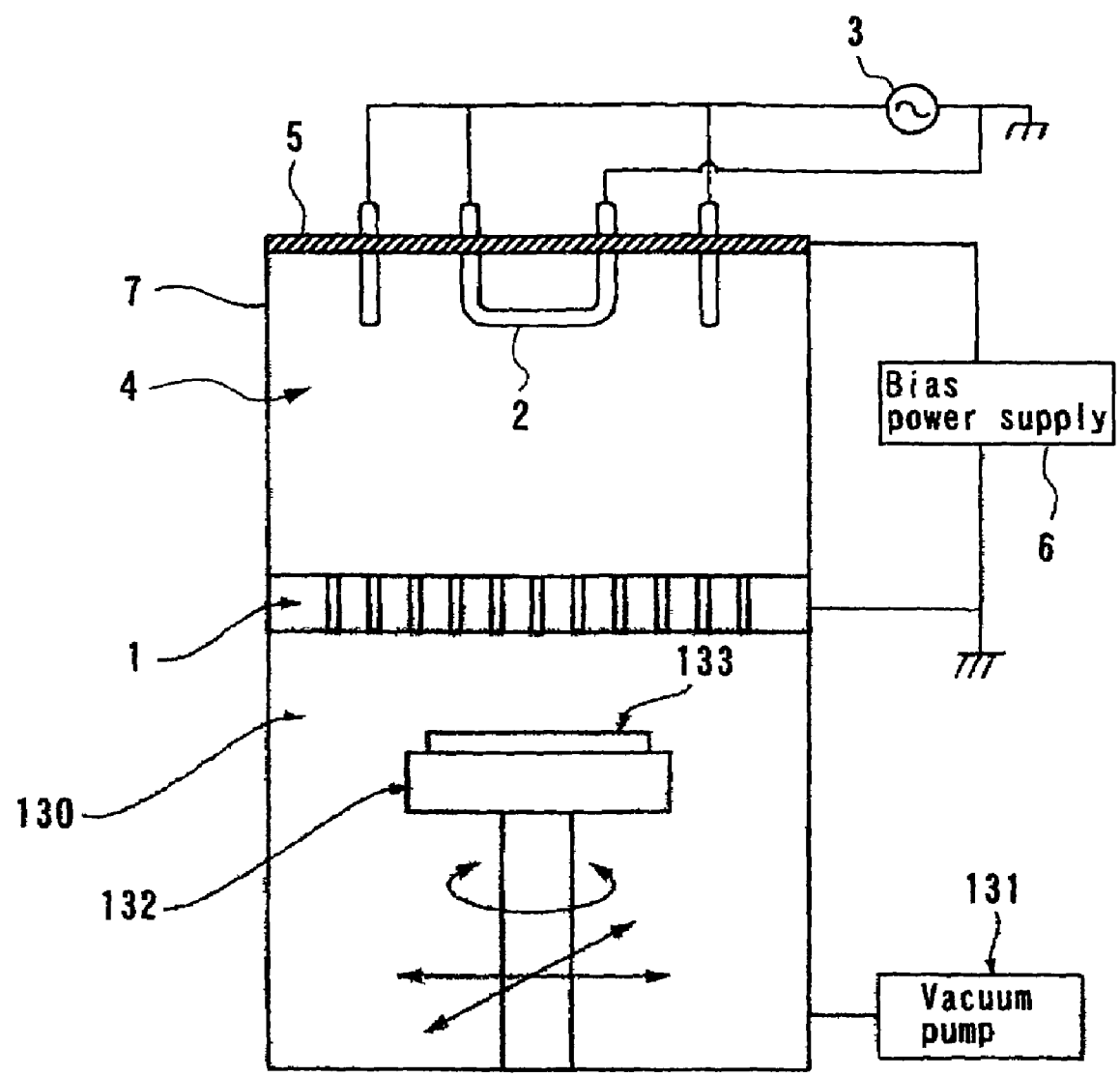

BEAM SOURCE AND BEAM PROCESSING APPARATUS

BACKGROUND OF THE INVENTION

1. Field of the Invention

The present invention relates to a beam source suitable for use in a manufacturing process of semiconductor integrated circuits, information storage media such as hard disks, fine optical elements, micromachines, and the like, and more particularly to a beam source for generating various kinds of highly directional and highly dense beams including a positive ion beam, a negative ion beam, and a neutral particle beam from high-density plasma. The present invention also relates to a beam processing apparatus having such a beam source.

2. Description of the Related Art

In recent years, semiconductor integrated circuits, information storage media such as hard disks, fine optical elements, micromachines, and the like have been processed in highly fine patterns. In fields of processing such workpieces, attention has been attracted to use of a high-density energetic beam which is highly linear, i.e., highly directional, and has a relatively large beam diameter. For example, an energetic beam is applied to a workpiece to thereby deposit a film on the workpiece or etch the workpiece.

As beam sources of such energetic beams, there have been used beam generators which generate various kinds of beams including a positive ion beam, a negative ion beam, and a neutral particle beam. The positive ion beam, the negative ion beam, or the neutral particle beam is applied to a desired area of a workpiece from the beam source to thereby locally deposit a film on the workpiece, etch the workpiece, modify a surface of the workpiece, or join or bond parts of the workpiece together.

FIG. 1 shows a conventional beam processing apparatus having such a beam source. As shown in FIG. 1, the beam processing apparatus has a beam generating chamber 240 and a coil 220 disposed around the beam generating chamber 240 for inductively coupled plasma (ICP). The beam processing apparatus also has a first electrode 210 disposed at a lower end of the beam generating chamber 240 and a second electrode 250 disposed above the first electrode 210. The first electrode 210 and the second electrode 250 are made of an electrically conductive material such as graphite, respectively. When a high-frequency current is supplied from a high-frequency power supply via a matching box to the coil 220, an induced magnetic field is produced in the beam generating chamber 240 by the coil 220. The varying magnetic field induces an electric field, which accelerates electrons to generate plasma in the beam generating chamber 240. Thus, by applying a proper voltage between the first electrode 210 and the second electrode 250, various kinds of beams including a positive ion beam, a negative ion beam, and a neutral particle beam can be applied to a workpiece X.

For mass production and reduction in cost of semiconductor integrated circuits, fabrication apparatuses for semiconductor integrated circuits should be capable of processing workpieces having larger diameters. When the diameter of a conventional ion beam source is increased so as to generate various kinds of beams including a positive ion beam, a negative ion beam, and a neutral particle beam, the following problems arise.

In order to generate a uniform beam having a large diameter, it is desirable that the density of plasma, which is a source of a beam, should be distributed uniformly in radial and circumferential directions of the beam generating chamber. As shown in FIG. 1, in the conventional beam source, the coil 220 for inductively coupled plasma is disposed around the beam generating chamber 240. Accordingly, the energy supplied by the coil 220 is larger at a peripheral area and smaller at a central area in the beam generating chamber 240. Thus, the generated plasma tends to have a non-uniform density distribution in a radial direction of the beam generating chamber 240 so as to have higher densities at the peripheral area and lower densities at the central area in the beam generating chamber 240. When the beam generating chamber 240 has a diameter of about 100 mm, the coil 220 can supply sufficient energy to the central area of the beam generating chamber 240 so that the ununiformity of the plasma density is hardly caused. However, when the beam generating chamber 240 is increased in size to generate a beam having a larger diameter, the coil 220 cannot supply sufficient energy to the central area of the beam generating chamber 240. In such a case, the plasma density becomes non-uniform in the radial direction so as to make it difficult to generate a uniform beam.

Thus, in order to generate a uniform beam having a large diameter, it is necessary to generate uniform plasma having a large diameter. In order to generate such uniform plasma having a large diameter, there has been known to dispose a coil for inductively coupled plasma so as to face a workpiece.

In the conventional beam processing apparatus, charged particles such as positive ions or negative ions are applied to a workpiece unless a proper neutralization device is provided. In such a beam processing apparatus which applies charged particles to a workpiece, an insulated workpiece cannot be processed because of a charge build-up phenomenon in which electric charges are built up on the workpiece. Further, since the ion beam emitted from the beam source tends to spread due to the space-charge effect, the workpiece cannot be processed in a fine pattern.

In order to solve the above problems, there has been proposed a method of introducing electrons into the ion beam to neutralize the electric charges. This method can balance the electric charges on the workpiece as a whole. However, since local unbalance of the electric charges still remains on the workpiece, the workpiece cannot be processed in a fine pattern.

In the case where ions are extracted from a plasma source and applied to a workpiece, if a radiation (e.g. an ultraviolet ray) produced by the plasma source is applied to the workpiece, then the radiation adversely affects the workpiece. Thus, it is necessary to shield the workpiece from an adverse radiation (e.g. an ultraviolet ray) emitted from the plasma source.

Thus, it is desired to provide a beam source which can uniformly apply various kinds of beams including a positive ion beam, a negative ion beam, and a neutral particle beam so as to solve the aforementioned problems.

FIG. 2 shows a conventional neutral particle beam generating apparatus as disclosed by U.S. Pat. No. 6,331,701. As shown in FIG. 2, the neutral particle beam generating apparatus has an RF generator 291, an RF inductor 293 connected via an impedance matching device 292 to the RF generator 291, an RF window 294 disposed adjacent to the RF inductor 293, an RF accelerator 297 connected to an RF accelerator circuit 296, and an RF-grounded sub-Debye neutralizer grid 312 disposed so as to face the RF accelerator 297. The RF accelerator 297 is disposed so as to face the RF window 294.

With the above arrangement, RF power is supplied by the RF inductor 293 to generate plasma 295, 299. A potential difference is produced between the RF accelerator 297 and the sub-Debye neutralizer grid 312 to accelerate positive ions from the plasma 299 toward the sub-Debye neutralizer grid 312, which has grid holes 317. The accelerated positive ions are neutralized through the sub-Debye neutralizer grid 312 when they pass through the grid holes 317 in the sub-Debye neutralizer grid 312. Thus, the apparatus shown in FIG. 2 has a coil for inductively coupled plasma, which is disposed so as to face a workpiece in order to generate uniform plasma, a proper neutralization device, and a device for shielding radiation from being applied to the workpiece.

In order to generate a collimated beam having a high neutralization efficiency, the grid holes 317 in the sub-Debye neutralizer grid 312 should have a diameter smaller than the thickness of a sheath 311 formed between the plasma 299 and the sub-Debye neutralizer grid 312 and also should have a high aspect ratio of about 10. For these purposes, the manufacturing cost rises, and only limited materials can be used for the sub-Debye neutralizer grid 312. According to U.S. Pat. No. 6,331,701, aluminum is used for the sub-Debye neutralizer grid 312. However, because aluminum is likely to deform due to heat, it is an unsuitable material for a beam source having a large diameter of about 10 inches. Thus, it is difficult to generate a uniform beam having a large diameter with the neutral particle beam generating apparatus as disclosed by U.S. Pat. No. 6,331,701.

SUMMARY OF THE INVENTION

The present invention has been made in view of the above drawbacks. It is, therefore, an object of the present invention to provide a beam source and a beam processing apparatus which can uniformly apply various kinds of beams including a positive ion beam, a negative ion beam, and a neutral particle beam with a large diameter.

According to a first aspect of the present invention, there is provided a beam source having a plasma generating chamber, an antenna for generating plasma in the plasma generating chamber, a first electrode disposed in the plasma generating chamber, and a second electrode disposed in the plasma generating chamber. Both of the antenna and the second electrode face the first electrode. The beam source also includes a power supply for applying a voltage between the first electrode and the second electrode to extract ions from the plasma generated by the antenna. The beam source may comprise a plurality of antennas.

With the above arrangement, it is possible to uniformly generate various kinds of beams having a large diameter, such as a positive ion beam, a negative ion beam, and a neutral particle beam. In particular, the beam source causes no charge build-up phenomenon and can shield radiation form the plasma. Thus, it is possible to provide a beam source that causes no damage to a workpiece.

In this case, the antenna may be disposed outside of the plasma generating chamber, and the second electrode in the form of a circular plate may be disposed inwardly of the antenna. Alternatively, the antenna may have a spiral shape, and the second electrode may have a spiral shape positioned between adjacent spiral lines of the spiral shape of the antenna. The antenna may be formed by a plurality of divided antennas, and the second electrode may be formed by a plurality of divided second electrodes.

According to a second aspect of the present invention, there is provided a beam source having a plasma generating chamber and an antenna for generating plasma in the plasma generating chamber. The beam source includes a first electrode disposed in the plasma generating chamber so as to face the antenna, and a second electrode disposed between the antenna and the first electrode in the plasma generating chamber. The second electrode has a ring shape so as to surround the plasma generating chamber. The beam source also includes a power supply for applying a voltage between the first electrode and the second electrode to extract ions from the plasma generated by the antenna.

With the above arrangement, it is possible to uniformly generate various kinds of beams having a large diameter, such as a positive ion beam, a negative ion beam, and a neutral particle beam.

In this case, the beam source may have a container for defining the plasma generating chamber. The container may have a wall which serves as the second electrode. With this arrangement, it is possible to simplify the beam source and reduce the manufacturing cost of the beam source.

According to a preferred aspect of the present invention, the first electrode serves as a neutralization device for the ions extracted from the plasma. Specifically, the first electrode may comprise an orifice plate having a plurality of orifices for neutralizing the ions extracted from the plasma. With this arrangement, positive ions or negative ions are extracted from the plasma and neutralized into a neutral particle beam. Thus, it is possible to uniformly generate a highly directional neutral particle beam having a large kinetic energy and a large diameter.

According to a third aspect of the present invention, there is provided a beam processing apparatus having a stage for supporting a workpiece and the aforementioned beam source for applying a beam to the workpiece supported by the stage. The workpiece faces the first electrode in the beam source.

The above and other objects, features, and advantages of the present invention will be apparent from the following description when taken in conjunction with the accompanying drawings which illustrate preferred embodiments of the present invention by way of example.

BRIEF DESCRIPTION OF THE DRAWINGS

FIG. 2 is a schematic view showing a conventional neutral particle beam generating apparatus;

FIG. 15 is a cross-sectional view schematically showing a beam processing apparatus according to the present invention.

DETAILED DESCRIPTION OF THE PREFERRED EMBODIMENTS

Figure 1:
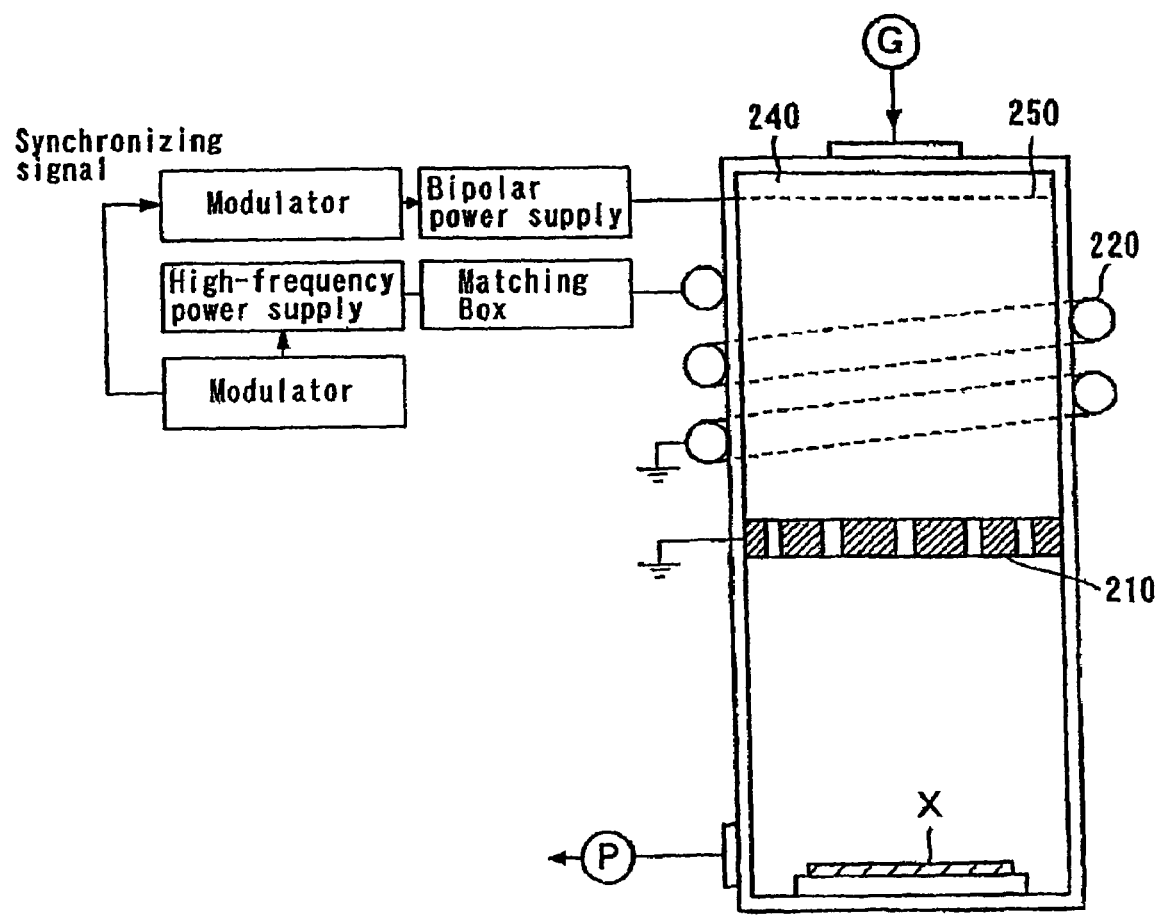
FIG. 1 is a schematic view showing a conventional beam processing apparatus having a beam source.

A beam source and a beam processing apparatus according to embodiments of the present invention will be described below with reference to FIGS. 3A through 15. Like or corresponding parts are denoted by like or corresponding reference numerals throughout drawings, and will not be described below repetitively.

Figure 3A:
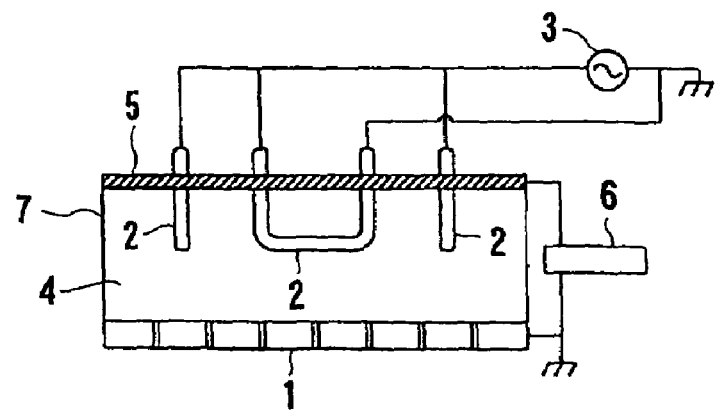
FIG. 3A is a cross-sectional view schematically showing a beam source according to a first embodiment of the present invention.

FIG. 3A is a schematic view showing a beam source according to a first embodiment of the present invention. As shown in FIG. 3A, the beam source has a cylindrical plasma generating chamber 4, a first electrode 1 disposed at a lower end of the plasma generating chamber 4, antennas 2 disposed within the plasma generating chamber 4 for generating plasma in the plasma generating chamber 4, and a second electrode 5 disposed in the plasma generating chamber 4 so as to face the first electrode 1.

The plasma generating chamber 4 is formed by a container 7 made of quartz glass, ceramics, metal, or the like. Quartz glass emits oxygen when it is exposed to plasma containing fluorocarbon. Accordingly, when the container 7 is made of quartz glass, oxygen is mixed as impurities in a beam so that a beam having desired components cannot be generated. Therefore, when the plasma contains fluorocarbon, the container 7 should be made of a material that emits no oxygen even if it is exposed to fluorocarbon, such as alumina.

The plasma generating chamber 4 has a gas inlet port (not shown) for introducing a gas into the plasma generating chamber 4. The gas inlet port is connected through a gas supply pipe (not shown) to a gas supply source (not shown), which supplies a gas such as $SF_6$, $CHF_3$, $CF_4$, $Cl_2$, Ar, $O_2$, $N_2$, and $C_4F_8$ into the plasma generating chamber 4.

The first electrode 1 is formed by an orifice plate (orifice electrode) made of an electrically conductive material such as graphite and electrically grounded. The orifice electrode 1 has a large number of orifices formed therein. The orifice electrode 1 serves as a first electrode and also serves as a neutralization device for beam particles.

The beam source is connected via the first electrode (orifice electrode) 1 to a vacuum chamber (not shown), which is evacuated by a vacuum pump (not shown) connected to the vacuum chamber. The pressure in the plasma generating chamber 4 is determined mainly by displacement of the vacuum pump, conductance of the orifice electrode 1, and types and a flow rate of gas supplied to the plasma generating chamber 4. The gas supplied may comprise a plurality of types of gas.

Figure 3B:
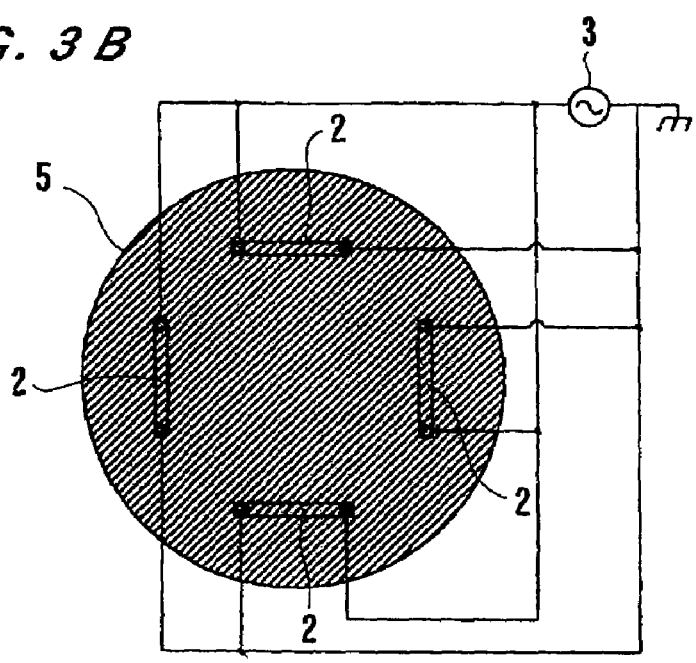
FIG. 3B is a plan view showing antennas and an electrode in the beam source shown in FIG. 3A.

FIG. 3B is a plan view showing the antennas 2 and the second electrode 5. As shown in FIGS. 3A and 3B, the antennas 2 are formed by at least one elongated conductive material having various shapes such as a hooked shape or an arcuate shape. The antennas 2 are connected via a matching box (not shown) to a high-frequency power supply 3, which applies a high-frequency voltage having a frequency of, for example, about 13.56 MHz, to the antennas 2. When a high-frequency current is supplied from the high-frequency power supply 3 via the matching box to the antennas 2, an induced magnetic field is produced in the plasma generating chamber 4 by the antennas 2. The varying magnetic field induces an electric field, which accelerates electrons to generate plasma in the plasma generating chamber 4. Thus, the antennas 2, the matching box, and the high-frequency power supply 3 form a plasma generator for generating plasma in the plasma generating chamber 4.

Figure 3C:
FIGS. 3C and 3D are graphs showing waveforms of voltages to be applied to the antennas shown in FIG. 3B.
Figure 3D:
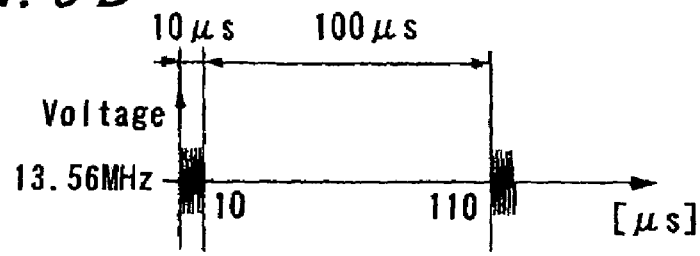

When a high-frequency voltage is supplied from the high-frequency power supply 3 to the antennas 2 in a continuous manner as shown in FIG. 3C, plasma mainly composed of positive ions and heated electrons is generated. When a high-frequency voltage is supplied from the high-frequency power supply 3 to the antennas 2 for 10 microseconds and then interrupted for 100 microseconds in an alternately repeated manner as shown in FIG. 3D, negative ions are generated efficiently and continuously. Thus, it is possible to generate plasma in which positive ions and negative ions coexist. Negative ions are generated as follows. During the interruption of the high-frequency voltage, electrons that have been heated during the application of the high-frequency voltage collide with particles that have maintained a neutral state without conversion into positive ions during the application of the high-frequency voltage. The collision mainly causes dissociative attachment to generate negative ions.

Thus, by changing the methods of supplying a high-frequency voltage from the high-frequency power supply 3, it is possible to generate two types of plasma including plasma mainly composed of positive ions and heated electrons and plasma in which positive ions and negative ions coexist.

Since the antennas 2 shown in FIG. 3A is disposed within the plasma generating chamber 4, this type of antennas is generally referred to as internal antennas. The antennas 2 may include a water-cooled pipe for cooling the antennas 2. The antennas 2 may have a conductive surface to a vacuum. Alternatively, the antennas 2 may have an insulation member covering the entire surface of a conductive material to prevent an increase of electrostatic coupling.

The second electrode 5 is made of an electrically conductive material such as graphite and connected to a bias power supply 6, which applies a bias voltage between the first electrode 1 and the second electrode 5 to extract a beam from the plasma generated by the antennas 2.

For example, when an electric potential of the first electrode (orifice electrode) 1 is lower than that of the second electrode 5, positive ions in the plasma are accelerated toward the orifice electrode 1 by the potential difference and introduced into the orifices in the orifice electrode 1. Most of the positive ions that are passing through the orifices in the orifice electrode 1 are collided with sidewall surfaces of the orifices and hence neutralized near solid sidewall surfaces of the orifices by electrons provided to the positive ions, or collided with electrons emitted from the surface of the orifice electrode 1 and hence neutralized by recombination with the electrons, or collided with gas molecules remaining within the orifices and hence neutralized by charge exchange with the gas molecules. Thus, the positive ions are converted into neutral particles, which are extracted as a neutral particle beam from the beam source.

Similarly, when an electric potential of the first electrode (orifice electrode) 1 is higher than that of the second electrode 5, negative ions in the plasma are accelerated toward the orifice electrode 1 by the potential difference and introduced into the orifices in the orifice electrode 1. Most of the negative ions that are passing through the orifices in the orifice electrode 1 are collided with sidewall surfaces of the orifices and hence neutralized near solid sidewall surfaces of the orifices by electrons removed from the negative ions, or collided with gas molecules remaining within the orifices and hence neutralized by charge exchange with the gas molecules. Thus, the negative ions are converted into neutral particles, which are extracted as a neutral particle beam from the beam source.

The antennas 2 and the second electrode 5 are electrically insulated from each other and disposed so as to face the first electrode 1. Since both of the antennas 2 and the second electrode 5 are disposed so as to face the first electrode 1, it is possible to generate uniform plasma having a large diameter and to extract a neutral particle beam from the plasma at the same time.

Thus, a neutral particle beam can be extracted and applied to a workpiece so as to provide a beam source that does not cause any charge build-up phenomenon. Further, since the plasma generating chamber 4 where the plasma is generated is optically isolated from the workpiece by the first electrode (orifice electrode) 1, the radiation produced by the plasma is not substantially applied to the workpiece. Specifically, it is possible to provide a beam source that can prevent any damage from being caused to the workpiece by the charge build-up phenomenon or radiation.

Figure 4A:
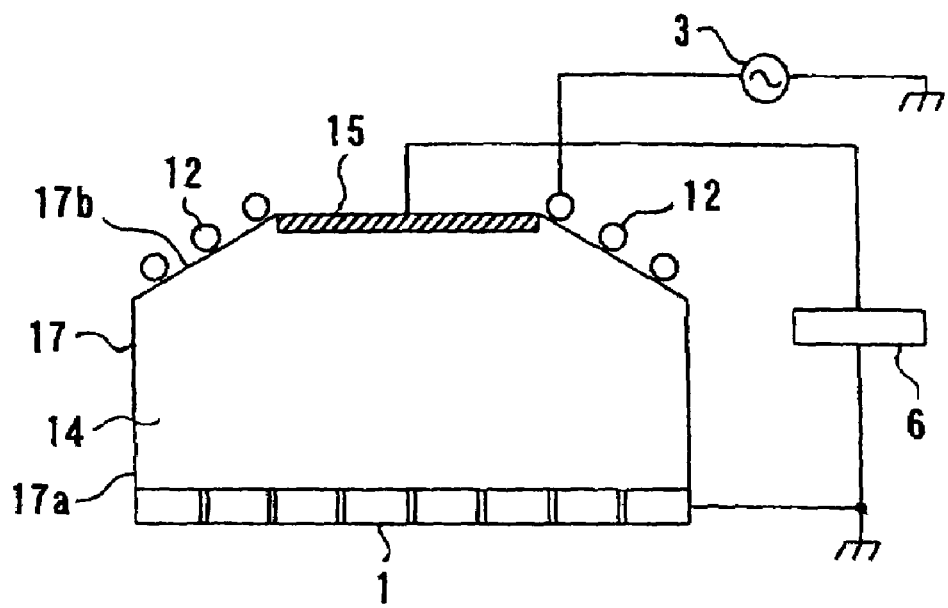
FIG. 4A is a cross-sectional view schematically showing a beam source according to a second embodiment of the present invention.

FIG. 4A is a schematic views showing a beam source according to a second embodiment of the present invention. As shown in FIG. 4A, the beam source has a plasma generating chamber 14, a first electrode 1 disposed at a lower end of the plasma generating chamber 14, antennas 12 disposed outside of the plasma generating chamber 14 for generating plasma in the plasma generating chamber 14, a second electrode 15 disposed in the plasma generating chamber 14 so as to face the first electrode 1.

The plasma generating chamber 14 is formed by a container 17 including a cylindrical portion 17a and a truncated conical portion 17b. The container 17 is made of quartz glass, ceramics, metal, or the like. Quartz glass emits oxygen when it is exposed to plasma containing fluorocarbon. Accordingly, when the container 17 is made of quartz glass, oxygen is mixed as impurities in a beam so that a beam having desired components cannot be generated. Therefore, when the plasma contains fluorocarbon, the container 17 should be made of a material that emits no oxygen even if it is exposed to fluorocarbon, such as alumina. The container 17 has a dielectric portion to generate plasma in the plasma generating chamber 14 by supplying a high-frequency current to the antennas 12.

The plasma generating chamber 14 has a gas inlet port (not shown) for introducing a gas into the plasma generating chamber 14. The gas inlet port is connected through a gas supply pipe (not shown) to a gas supply source (not shown), which supplies a gas such as $SF_6$, $CHF_3$, $CF_4$, $Cl_2$, Ar, $O_2$, $N_2$, and $C_4F_8$ into the plasma generating chamber 14.

The first electrode 1 is formed by an orifice plate (orifice electrode) made of an electrically conductive material such as graphite and electrically grounded. The orifice electrode 1 has a large number of orifices formed therein. The orifice electrode 1 serves as a first electrode and also serves as a neutralization device for beam particles.

The beam source is connected via the first electrode (orifice electrode) 1 to a vacuum chamber (not shown), which is evacuated by a vacuum pump (not shown) connected to the vacuum chamber. The pressure in the plasma generating chamber 14 is determined mainly by displacement of the vacuum pump, conductance of the orifice electrode 1, and types and a flow rate of gas supplied to the plasma generating chamber 14. The gas supplied may comprise a plurality of types of gas.

Figure 4B:
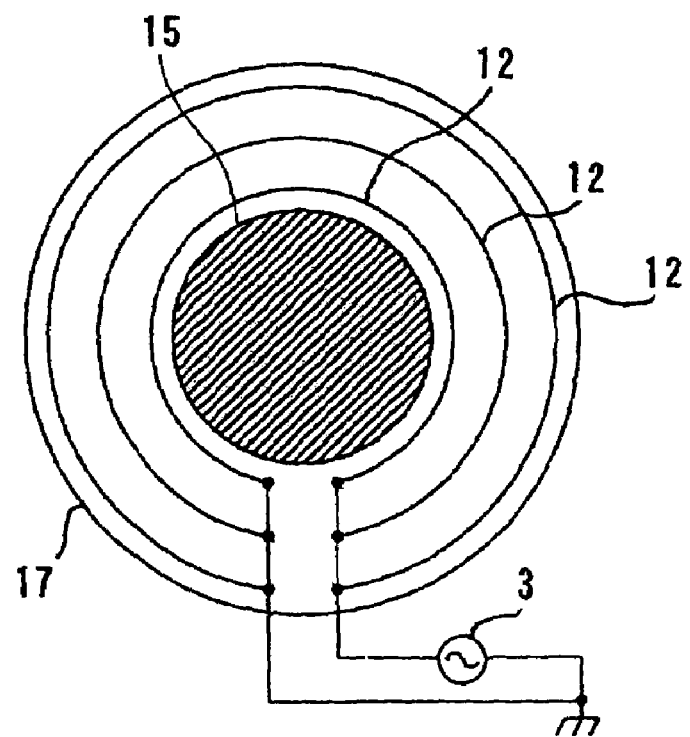
FIG. 4B is a plan view of the beam source shown in FIG. 4A.

FIG. 4B is a plan view showing the beam source shown in FIG. 4A. As shown in FIGS. 4A and 4B, the antennas 12 are formed by, for example, a single looped conductive material or a plurality of looped conductive materials connected in parallel to each other. The antennas 12 are connected via a matching box (not shown) to a high-frequency power supply 3, which applies a high-frequency voltage having a frequency of, for example, about 13.56 MHz, to the antennas 12. When a high-frequency current is supplied from the high-frequency power supply 3 via the matching box to the antennas 12, an induced magnetic field is produced in the plasma generating chamber 14 by the antennas 12. The varying magnetic field induces an electric field, which accelerates electrons to generate plasma in the plasma generating chamber 14. Thus, the antennas 12, the matching box, and the high-frequency power supply 3 form a plasma generator for generating plasma in the plasma generating chamber 14. The generated plasma is mainly composed of positive ions and heated electrons. The antennas 12 may include a water-cooled pipe for cooling the antennas 12.

When a high-frequency voltage is supplied from the high-frequency power supply 3 to the antennas 12 for 10 microseconds and then interrupted for 100 microseconds in an alternately repeated manner, negative ions are generated efficiently and continuously during the interruption of the high-frequency voltage. Thus, it is possible to generate plasma in which positive ions and negative ions coexist. Thus, by changing the methods of supplying a high-frequency voltage from the high-frequency power supply 3, it is possible to generate two types of plasma including plasma mainly composed of positive ions and heated electrons and plasma in which positive ions and negative ions coexist.

The second electrode 15 is made of an electrically conductive material such as graphite and connected to a bias power supply 6, which applies a bias voltage between the first electrode 1 and the second electrode 15 to extract a beam from the plasma generated by the antennas 12.

For example, when an electric potential of the first electrode (orifice electrode) 1 is lower than that of the second electrode 15, positive ions in the plasma are accelerated toward the orifice electrode 1 by the potential difference and introduced into the orifices in the orifice electrode 1. Most of the positive ions that are passing through the orifices in the orifice electrode 1 are collided with sidewall surfaces of the orifices and hence neutralized near solid sidewall surfaces of the orifices by electrons provided to the positive ions, or collided with electrons emitted from the surface of the orifice electrode 1 and hence neutralized by recombination with the electrons, or collided with gas molecules remaining within the orifices and hence neutralized by charge exchange with the gas molecules. Thus, the positive ions are converted into neutral particles, which are extracted as a neutral particle beam from the beam source.

Similarly, when an electric potential of the first electrode (orifice electrode) 1 is higher than that of the second electrode 15, negative ions in the plasma are accelerated toward the orifice electrode 1 by the potential difference and introduced into the orifices in the orifice electrode 1. Most of the negative ions that are passing through the orifices in the orifice electrode 1 are collided with sidewall surfaces of the orifices and hence neutralized near solid sidewall surfaces of the orifices by electrons removed from the negative ions, or collided with gas molecules remaining within the orifices and hence neutralized by charge exchange with the gas molecules. Thus, the negative ions are converted into neutral particles, which are extracted as a neutral particle beam from the beam source.

The second electrode 15 is electrically insulated from the antennas 12, which are disposed outside of the second electrode 15, so as to supply power from the antennas 12 to the plasma. Further, the antennas 12 and the second electrode 15 are disposed so as to face the first electrode 1. Since both of the antennas 12 and the second electrode 15 are disposed so as to face the first electrode 1, it is possible to generate uniform plasma having a large diameter and to extract a neutral particle beam from the plasma at the same time.

Thus, a neutral particle beam can be extracted and applied to a workpiece so as to provide a beam source that does not cause any charge build-up phenomenon. Further, since the plasma generating chamber 14 where the plasma is generated is optically isolated from the workpiece by the first electrode (orifice electrode) 1, the radiation produced by the plasma is not substantially applied to the workpiece. Specifically, it is possible to provide a beam source that can prevent any damage from being caused to the workpiece by the charge build-up phenomenon or radiation.

In FIG. 4B, the second electrode 15 has a circular shape. However, the second electrode 15 may have any shapes other than a circular shape. For example, the second electrode 15 may have a rectangular shape, a triangular shape, or other polygonal shapes, or an elliptical shape. Further, the second electrode 15 may be divided into a plurality of pieces so as to suppress an eddy current produced in the second electrode 15 in order to efficiently supply power from the antennas 12 to the plasma.

Figure 5A:
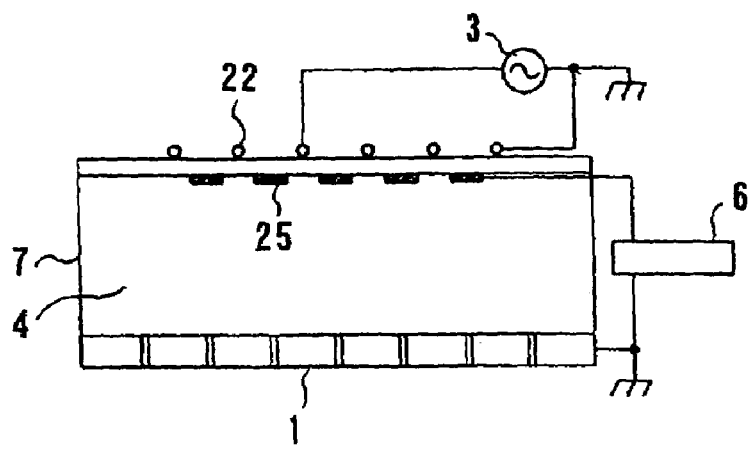
FIG. 5A is a cross-sectional view schematically showing a beam source according to a third embodiment of the present invention.

FIG. 5A is a schematic view showing a beam source according to a third embodiment of the present invention. As shown in FIG. 5A, the beam source has a cylindrical plasma generating chamber 4, a first electrode 1 disposed at a lower end of the plasma generating chamber 4, an antenna 22 disposed on an upper surface of the plasma generating chamber 4 for generating plasma in the plasma generating chamber 4, and a second electrode 25 disposed within the plasma generating chamber 4 so as to face the first electrode 1.

The plasma generating chamber 4 is formed by a container 7 made of quartz glass, ceramics, metal, or the like. Quartz glass emits oxygen when it is exposed to plasma containing fluorocarbon. Accordingly, when the container 7 is made of quartz glass, oxygen is mixed as impurities in a beam so that a beam having desired components cannot be generated. Therefore, when the plasma contains fluorocarbon, the container 7 should be made of a material that emits no oxygen even if it is exposed to fluorocarbon, such as alumina. The container 7 has a dielectric portion to generate plasma in the plasma generating chamber 4 by supplying a high-frequency current to the antenna 22.

The plasma generating chamber 4 has a gas inlet port (not shown) for introducing a gas into the plasma generating chamber 4. The gas inlet port is connected through a gas supply pipe (not shown) to a gas supply source (not shown), which supplies a gas such as $SF_6$, $CHF_3$, $CF_4$, $Cl_2$, Ar, $O_2$, $N_2$, and $C_4F_8$ into the plasma generating chamber 4.

The first electrode 1 is formed by an orifice plate (orifice electrode) made of an electrically conductive material such as graphite and electrically grounded. The orifice electrode 1 has a large number of orifices formed therein. The orifice electrode 1 serves as a first electrode and also serves as a neutralization device for beam particles.

The beam source is connected via the first electrode (orifice electrode) 1 to a vacuum chamber (not shown), which is evacuated by a vacuum pump (not shown) connected to the vacuum chamber. The pressure in the plasma generating chamber 4 is determined mainly by displacement of the vacuum pump, conductance of the orifice electrode 1, and types and a flow rate of gas supplied to the plasma generating chamber 4. The gas supplied may comprise a plurality of types of gas.

Figure 5B:
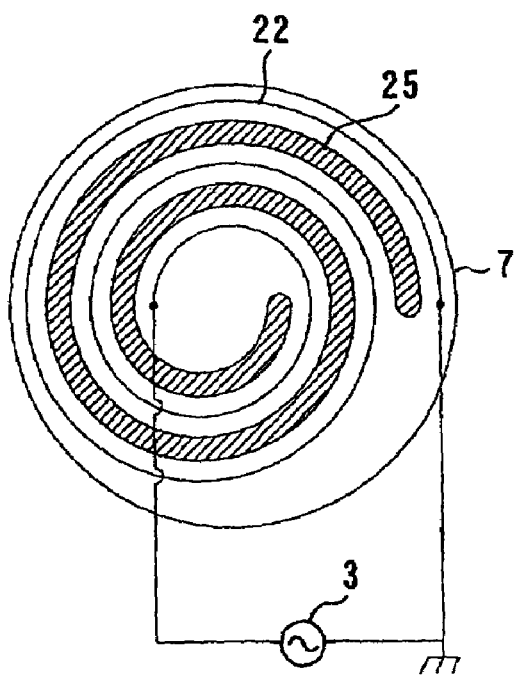
FIG. 5B is a plan view of the beam source shown in FIG. 5A.

FIG. 5B is a plan view showing the beam source shown in FIG. 5A. As shown in FIGS. 5A and 5B, the antenna 22 is formed by a spiral elongated conductive material. The antenna 22 is connected via a matching box (not shown) to a high-frequency power supply 3, which applies a high-frequency voltage having a frequency of, for example, about 13.56 MHz, to the antenna 22. When a high-frequency current is supplied from the high-frequency power supply 3 via the matching box to the antenna 22, an induced magnetic field is produced in the plasma generating chamber 4 by the antenna 22. The varying magnetic field induces an electric field, which accelerates electrons to generate plasma in the plasma generating chamber 4. Thus, the antenna 22, the matching box, and the high-frequency power supply 3 form a plasma generator for generating plasma in the plasma generating chamber 4. The generated plasma is mainly composed of positive ions and heated electrons. The antenna 22 may include a water-cooled pipe for cooling the antenna 22.

When a high-frequency voltage is supplied from the high-frequency power supply 3 to the antenna 22 for 10 microseconds and then interrupted for 100 microseconds in an alternately repeated manner, negative ions are generated efficiently and continuously during the interruption of the high-frequency voltage. Thus, it is possible to generate plasma in which positive ions and negative ions coexist. Thus, by changing the methods of supplying a high-frequency voltage from the high-frequency power supply 3, it is possible to generate two types of plasma including plasma mainly composed of positive ions and heated electrons and plasma in which positive ions and negative ions coexist.

The second electrode 25 is made of an electrically conductive material such as graphite and connected to a bias power supply 6, which applies a bias voltage between the first electrode 1 and the second electrode 25 to extract a beam from the plasma generated by the antenna 22.

For example, when an electric potential of the first electrode (orifice electrode) 1 is lower than that of the second electrode 25, positive ions in the plasma are accelerated toward the orifice electrode 1 by the potential difference and introduced into the orifices in the orifice electrode 1. Most of the positive ions that are passing through the orifices in the orifice electrode 1 are collided with sidewall surfaces of the orifices and hence neutralized near solid sidewall surfaces of the orifices by electrons provided to the positive ions, or collided with electrons emitted from the surface of the orifice electrode 1 and hence neutralized by recombination with the electrons, or collided with gas molecules remaining within the orifices and hence neutralized by charge exchange with the gas molecules. Thus, the positive ions are converted into neutral particles, which are extracted as a neutral particle beam from the beam source.

Similarly, when an electric potential of the first electrode (orifice electrode) 1 is higher than that of the second electrode 25, negative ions in the plasma are accelerated toward the orifice electrode 1 by the potential difference and introduced into the orifices in the orifice electrode 1. Most of the negative ions that are passing through the orifices in the orifice electrode 1 are collided with sidewall surfaces of the orifices and hence neutralized near solid sidewall surfaces of the orifices by electrons removed from the negative ions, or collided with gas molecules remaining within the orifices and hence neutralized by charge exchange with the gas molecules. Thus, the negative ions are converted into neutral particles, which are extracted as a neutral particle beam from the beam source.

Figure 5C:
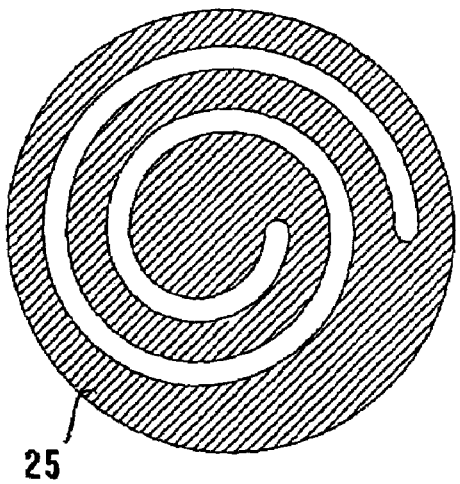
FIG. 5C is a plan view showing a variation of the beam source shown in FIG. 5B.

As shown in FIG. 5B, the second electrode 25 has a spiral shape positioned between adjacent spiral lines of the antenna 22 so as to supply power from the antenna 22 to the plasma. As shown in FIG. 5C, the second electrode 25 may have an opening corresponding to the spiral lines of the antenna 22.

Further, the antenna 22 and the second electrode 25 are disposed so as to face the first electrode 1. Since both of the antenna 22 and the second electrode 25 are disposed so as to face the first electrode 1, it is possible to generate uniform plasma having a large diameter and to extract a neutral particle beam from the plasma at the same time.

Thus, a neutral particle beam can be extracted and applied to a workpiece so as to provide a beam source that does not cause any charge build-up phenomenon. Further, since the plasma generating chamber 4 where the plasma is generated is optically isolated from the workpiece by the first electrode (orifice electrode) 1, the radiation produced by the plasma is not substantially applied to the workpiece. Specifically, it is possible to provide a beam source that can prevent any damage from being caused to the workpiece by the charge build-up phenomenon or radiation.

Figure 6A:
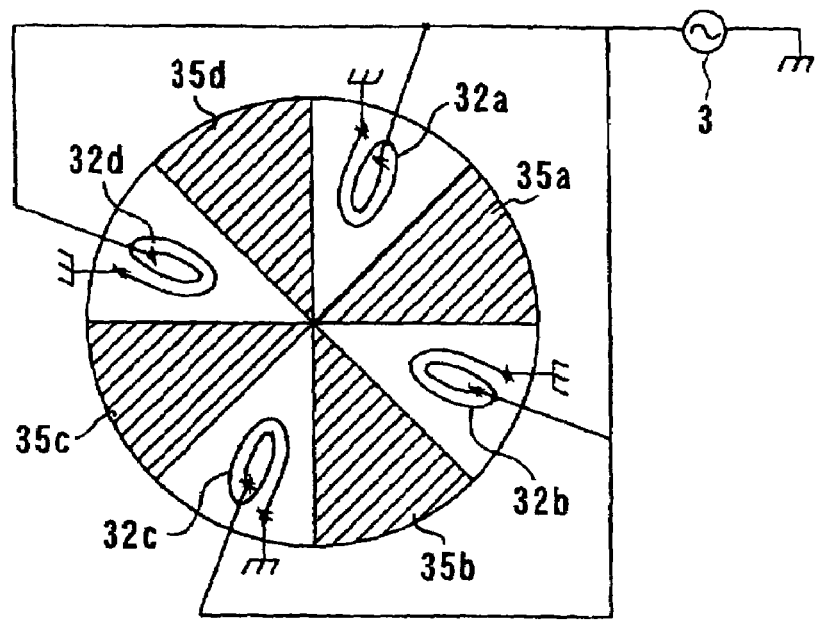
FIG. 6A is a schematic view showing an arrangement of antennas and second electrodes of a beam source according to a fourth embodiment of the present invention.

FIG. 6A is a schematic view showing an arrangement of antennas and second electrodes of a beam source according to a fourth embodiment of the present invention. FIG. 6A shows the beam source as viewed from above the plasma generating chamber. The beam source has a cylindrical plasma generating chamber as shown in FIGS. 3A and 5A. The plasma generating chamber may have a combination of a cylindrical portion and a truncated conical portion as shown in FIG. 4A, or a combination of a cylindrical portion and a conical portion.

As with the above embodiments shown in FIGS. 3A, 4A, and 5A, the beam source has a first electrode (not shown) disposed at a lower end of the plasma generating chamber. The beam source also has a plurality of antennas 32a, 32b, 32c, and 32d disposed at an upper portion of the plasma generating chamber for generating plasma in the plasma generating chamber, a plurality of second electrodes 35a, 35b, 35c, and 35d disposed in the plasma generating chamber so as to face the first electrode.

As shown in FIG. 6A, each of the antennas 32a, 32b, 32c, and 32d has a spiral shape. Four antennas 32a, 32b, 32c, and 32d are disposed at equal intervals so as to generate plasma as uniformly as possible in the plasma generating chamber. Each of the second electrodes 35a, 35b, 35c, and 35d has a sectorial shape. These second electrodes 35a, 35b, 35c, and 35d are disposed in the plasma generating chamber between the adjacent antennas so as to face the first electrode.

The plasma generating chamber is formed by a container made of quartz glass, ceramics, metal, or the like. Quartz glass emits oxygen when it is exposed to plasma containing fluorocarbon. Accordingly, when the container is made of quartz glass, oxygen is mixed as impurities in a beam so that a beam having desired components cannot be generated. Therefore, when the plasma contains fluorocarbon, the container should be made of a material that emits no oxygen even if it is exposed to fluorocarbon, such as alumina. The container has a dielectric portion to generate plasma in the plasma generating chamber by supplying a high-frequency current to the antennas 32a, 32b, 32c, and 32d.

The plasma generating chamber has a gas inlet port (not shown) for introducing a gas into the plasma generating chamber. The gas inlet port is connected through a gas supply pipe (not shown) to a gas supply source (not shown), which supplies a gas such as $SF_6$, $CHF_3$, $CF_4$, $Cl_2$, Ar, $O_2$, $N_2$, and $C_4F_8$ into the plasma generating chamber.

The first electrode is formed by an orifice plate (orifice electrode) made of an electrically conductive material such as graphite and electrically grounded. The orifice electrode has a large number of orifices formed therein. The orifice electrode serves as a first electrode and also serves as a neutralization device for beam particles.

The beam source is connected via the first electrode (orifice electrode) to a vacuum chamber (not shown), which is evacuated by a vacuum pump (not shown) connected to the vacuum chamber. The pressure in the plasma generating chamber is determined mainly by displacement of the vacuum pump, conductance of the orifice electrode, and types and a flow rate of gas supplied to the plasma generating chamber. The gas supplied may comprise a plurality of types of gas.

The antennas 32a, 32b, 32c, and 32d are formed by at least two spiral elongated conductive materials connected in parallel to each other. The antennas 32a, 32b, 32c, and 32d are connected via a matching box (not shown) to a high-frequency power supply 3, which applies a high-frequency voltage having a frequency of, for example, about 13.56 MHz, to the antennas 32a, 32b, 32c, and 32d. When a high-frequency current is supplied from the high-frequency power supply 3 via the matching box to the antennas 32a, 32b, 32c, and 32d, an induced magnetic field is produced in the plasma generating chamber by the antennas 32a, 32b, 32c, and 32d. The varying magnetic field induces an electric field, which accelerates electrons to generate plasma in the plasma generating chamber. Thus, the antennas 32a, 32b, 32c, and 32d, the matching box, and the high-frequency power supply 3 form a plasma generator for generating plasma in the plasma generating chamber. The generated plasma is mainly composed of positive ions and heated electrons. The antennas 32a, 32b, 32c, and 32d may include a water-cooled pipe for cooling the antennas 32a, 32b, 32c, and 32d.

When a high-frequency voltage is supplied from the high-frequency power supply 3 to the antennas 32a, 32b, 32c, and 32d for 10 microseconds and then interrupted for 100 microseconds in an alternately repeated manner, negative ions are generated efficiently and continuously during the interruption of the high-frequency voltage. Thus, it is possible to generate plasma in which positive ions and negative ions coexist. Thus, by changing the methods of supplying a high-frequency voltage from the high-frequency power supply 3, it is possible to generate two types of plasma including plasma mainly composed of positive ions and heated electrons and plasma in which positive ions and negative ions coexist.

As with the above embodiments shown in FIGS. 3A, 4A, and 5A, the second electrodes 35a, 35b, 35c, and 35d are made of an electrically conductive material such as graphite and connected to a bias power supply, which applies a bias voltage between the first electrode and the second electrodes 35a, 35b, 35c, and 35d to extract a beam from the plasma generated by the antennas 32a, 32b, 32c, and 32d.

For example, when an electric potential of the first electrode (orifice electrode) is lower than that of the second electrodes 35a, 35b, 35c, and 35d, positive ions in the plasma are accelerated toward the orifice electrode by the potential difference and introduced into the orifices in the orifice electrode. Most of the positive ions that are passing through the orifices in the orifice electrode are collided with sidewall surfaces of the orifices and hence neutralized near solid sidewall surfaces of the orifices by electrons provided to the positive ions, or collided with electrons emitted from the surface of the orifice electrode and hence neutralized by recombination with the electrons, or collided with gas molecules remaining within the orifices and hence neutralized by charge exchange with the gas molecules. Thus, the positive ions are converted into neutral particles, which are extracted as a neutral particle beam from the beam source.

Similarly, when an electric potential of the first electrode (orifice electrode) is higher than that of the second electrodes 35a, 35b, 35c, and 35d, negative ions in the plasma are accelerated toward the orifice electrode by the potential difference and introduced into the orifices in the orifice electrode. Most of the negative ions that are passing through the orifices in the orifice electrode are collided with sidewall surfaces of the orifices and hence neutralized near solid sidewall surfaces of the orifices by electrons removed from the negative ions, or collided with gas molecules remaining within the orifices and hence neutralized by charge exchange with the gas molecules. Thus, the negative ions are converted into neutral particles, which are extracted as a neutral particle beam from the beam source.

The antennas 32a, 32b, 32c, and 32d and the second electrodes 35a, 35b, 35c, and 35d are disposed so as to face the first electrode. Since both of the antennas 32a, 32b, 32c, and 32d and the second electrodes 35a, 35b, 35c, and 35d are disposed so as to face the first electrode, it is possible to generate uniform plasma having a large diameter and to extract a neutral particle beam from the plasma at the same time. Further, since the individual antennas 32a, 32b, 32c, and 32d can be made small in size, the impedance of the antennas 32a, 32b, 32c, and 32d can be lowered. Thus, it is possible to reduce loads to be imposed on the matching box.

Figure 6B:
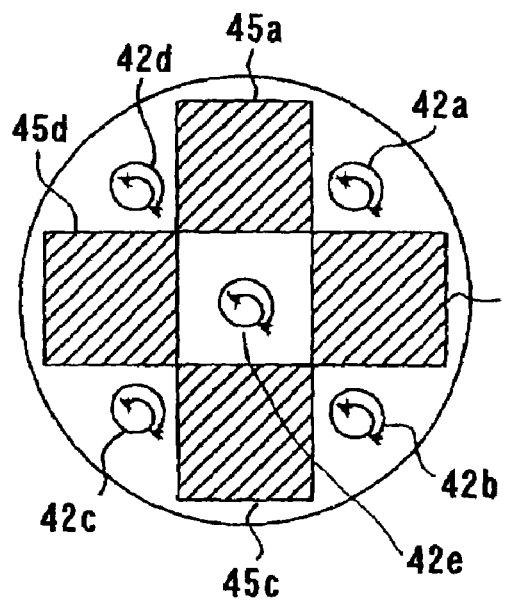
FIG. 6B is a schematic view showing an arrangement of antennas and second electrodes of a beam source according to a fifth embodiment of the present invention.

FIG. 6B is a schematic view showing an arrangement of antennas and second electrodes of a beam source according to a fifth embodiment of the present invention. The fifth embodiment has an arrangement to uniformize plasma to be generated. As shown in FIG. 6B, the beam source has rectangular second electrodes 45a, 45b, 45c, and 45d and antennas 42a, 42b, 42c, and 42d disposed between the second electrodes 45a, 45b, 45c, and 45d. In this example, an antenna 42e is disposed at a central area surrounded by the second electrodes 45a, 45b, 45c, and 45d.

Figure 6C:
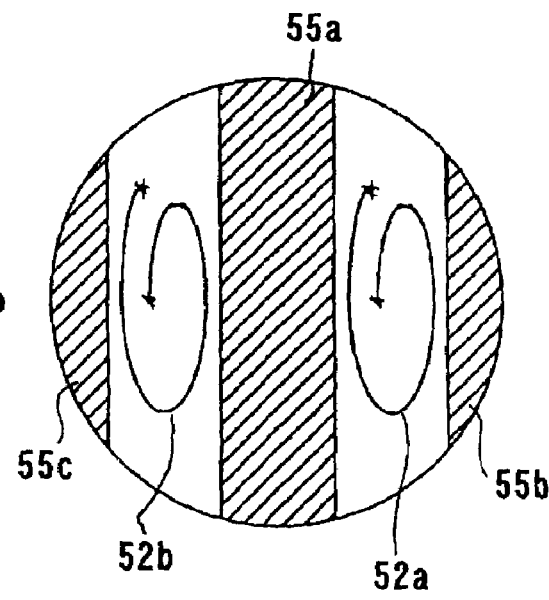
FIG. 6C is a schematic view showing an arrangement of antennas and second electrodes of a beam source according to a sixth embodiment of the present invention.

FIG. 6C is a schematic view showing an arrangement of antennas and second electrodes of a beam source according to a sixth embodiment of the present invention. The sixth embodiment also has an arrangement to uniformize plasma to be generated. As shown in FIG. 6C, the beam source has second electrodes 55a, 55b, and 55c divided in parallel and antennas 52a and 52b disposed between the second electrodes 55a, 55b, and 55c.

Figure 7A:
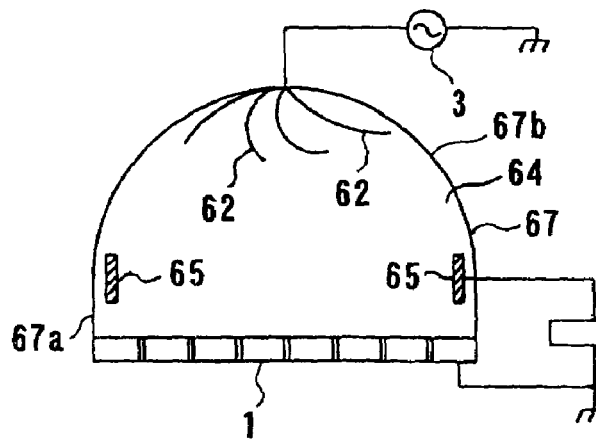
FIG. 7A is a cross-sectional view schematically showing a beam source according to a seventh embodiment of the present invention.

FIG. 7A is a schematic view showing a beam source according to a seventh embodiment of the present invention. As shown in FIG. 7A, the beam source has a plasma generating chamber 64, a first electrode 1 disposed at a lower end of the plasma generating chamber 64, antennas 62 disposed outside of the plasma generating chamber 64 for generating plasma in the plasma generating chamber 64, and a second electrodes 65 disposed within the plasma generating chamber 64 so as to face the first electrode 1.

The plasma generating chamber 64 is formed by a container 67 including a cylindrical portion 67a and a dome portion 67b. The antennas 62 are disposed on an outer surface of the dome portion 67b. The container 67 is made of quartz glass, ceramics, metal, or the like. Quartz glass emits oxygen when it is exposed to plasma containing fluorocarbon. Accordingly, when the container 67 is made of quartz glass, oxygen is mixed as impurities in a beam so that a beam having desired components cannot be generated. Therefore, when the plasma contains fluorocarbon, the container 67 should be made of a material that emits no oxygen even if it is exposed to fluorocarbon, such as alumina. The container 67 has a dielectric portion to generate plasma in the plasma generating chamber 64 by supplying a high-frequency current to the antennas 62.

The plasma generating chamber 64 has a gas inlet port (not shown) for introducing a gas into the plasma generating chamber 64. The gas inlet port is connected through a gas supply pipe (not shown) to a gas supply source (not shown), which supplies a gas such as $SF_6$, $CHF_3$, $CF_4$, $Cl_2$, Ar, $O_2$, $N_2$, and $C_4F_8$ into the plasma generating chamber 64.

The first electrode 1 is formed by an orifice plate (orifice electrode) made of an electrically conductive material such as graphite and electrically grounded. The orifice electrode 1 has a large number of orifices formed therein. The orifice electrode 1 serves as a first electrode and also serves as a neutralization device for beam particles.

The beam source is connected via the first electrode (orifice electrode) 1 to a vacuum chamber (not shown), which is evacuated by a vacuum pump (not shown) connected to the vacuum chamber. The pressure in the plasma generating chamber 64 is determined mainly by displacement of the vacuum pump, conductance of the orifice electrode 1, and types and a flow rate of gas supplied to the plasma generating chamber 64.

Figure 7B:
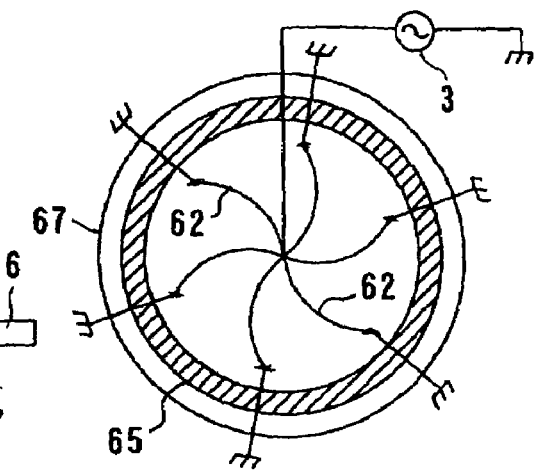
FIG. 7B is a plan view of the beam source shown in FIG. 7A.

FIG. 7B is a plan view showing the beam source shown in FIG. 7A. As shown in FIGS. 7A and 7B, the antennas 62 are formed by, for example, a single spiral conductive material or a plurality of spiral conductive materials connected in parallel to each other. The antennas 62 are connected via a matching box (not shown) to a high-frequency power supply 3, which applies a high-frequency voltage having a frequency of, for example, about 13.56 MHz, to the antennas 62. When a high-frequency current is supplied from the high-frequency power supply 3 via the matching box to the antennas 62, an induced magnetic field is produced in the plasma generating chamber 64 by the antennas 62. The varying magnetic field induces an electric field, which accelerates electrons to generate plasma in the plasma generating chamber 64. Thus, the antennas 62, the matching box, and the high-frequency power supply 3 form a plasma generator for generating plasma in the plasma generating chamber 64. The generated plasma is mainly composed of positive ions and heated electrons. The antennas 62 may include a water-cooled pipe for cooling the antennas 62.

When a high-frequency voltage is supplied from the high-frequency power supply 3 to the antennas 62 for 10 microseconds and then interrupted for 100 microseconds in an alternately repeated manner, negative ions are generated efficiently and continuously during the interruption of the high-frequency voltage. Thus, it is possible to generate plasma in which positive ions and negative ions coexist. Thus, by changing the methods of supplying a high-frequency voltage from the high-frequency power supply 3, it is possible to generate two types of plasma including plasma mainly composed of positive ions and heated electrons and plasma in which positive ions and negative ions coexist.

The second electrode 65 is made of an electrically conductive material such as graphite and connected to a bias power supply 6, which applies a bias voltage between the first electrode 1 and the second electrode 65 to extract a beam from the plasma generated by the antennas 62.

For example, when an electric potential of the first electrode (orifice electrode) 1 is lower than that of the second electrode 65, positive ions in the plasma are accelerated toward the orifice electrode 1 by the potential difference and introduced into the orifices in the orifice electrode 1. Most of the positive ions that are passing through the orifices in the orifice electrode 1 are collided with sidewall surfaces of the orifices and hence neutralized near solid sidewall surfaces of the orifices by electrons provided to the positive ions, or collided with electrons emitted from the surface of the orifice electrode 1 and hence neutralized by recombination with the electrons, or collided with gas molecules remaining within the orifices and hence neutralized by charge exchange with the gas molecules. Thus, the positive ions are converted into neutral particles, which are extracted as a neutral particle beam from the beam source.

Similarly, when an electric potential of the first electrode (orifice electrode) 1 is higher than that of the second electrode 65, negative ions in the plasma are accelerated toward the orifice electrode 1 by the potential difference and introduced into the orifices in the orifice electrode 1. Most of the negative ions that are passing through the orifices in the orifice electrode 1 are collided with sidewall surfaces of the orifices and hence neutralized near solid sidewall surfaces of the orifices by electrons removed from the negative ions, or collided with gas molecules remaining within the orifices and hence neutralized by charge exchange with the gas molecules. Thus, the negative ions are converted into neutral particles, which are extracted as a neutral particle beam from the beam source.

The second electrode 65 has a ring shape surrounding the plasma generating chamber 64 at a peripheral portion of the plasma generating chamber 64. The second electrode 65 is arranged so as not to shield an electric field and a magnetic field from the antennas 62. Thus, the beam source according to the present embodiment is likely to uniformly generate high-density plasma. When the generated plasma is positive ion plasma mainly composed of positive ions and heated electrons and has a high plasma density of at least $10^{11}$ ions/cm$^3$, a potential distribution becomes substantially uniform in the plasma. Because a voltage drop is caused in a sheath produced between the first electrode 1 and the plasma, ions are accelerated by the sheath. Thus, it is possible to uniformly extract ions even through the second electrode 65 has a ring shape. In this manner, since the second electrode 65 has a ring shape so as not to shield supply of power from the antennas 62 to the plasma, it is possible to generate uniform plasma having a large diameter and to extract a neutral particle beam from the plasma at the same time.

Thus, a neutral particle beam can be extracted and applied to a workpiece so as to provide a beam source that does not cause any charge build-up phenomenon. Further, since the plasma generating chamber 64 where the plasma is generated is optically isolated from the workpiece by the first electrode (orifice electrode) 1, the radiation produced by the plasma is not substantially applied to the workpiece. Specifically, it is possible to provide a beam source that can prevent any damage from being caused to the workpiece by the charge build-up phenomenon or radiation.

Figure 7C:
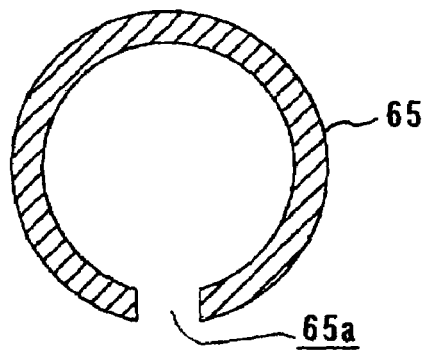
FIG. 7C is a plan view showing a variation of a second electrode shown in FIG. 7B.

In order to efficiently supply power from the antennas 62 to the plasma, as shown in FIG. 7C, the second electrode 65 may have a slit 65a so as to suppress an eddy current produced in the second electrode 65.

Figure 8:
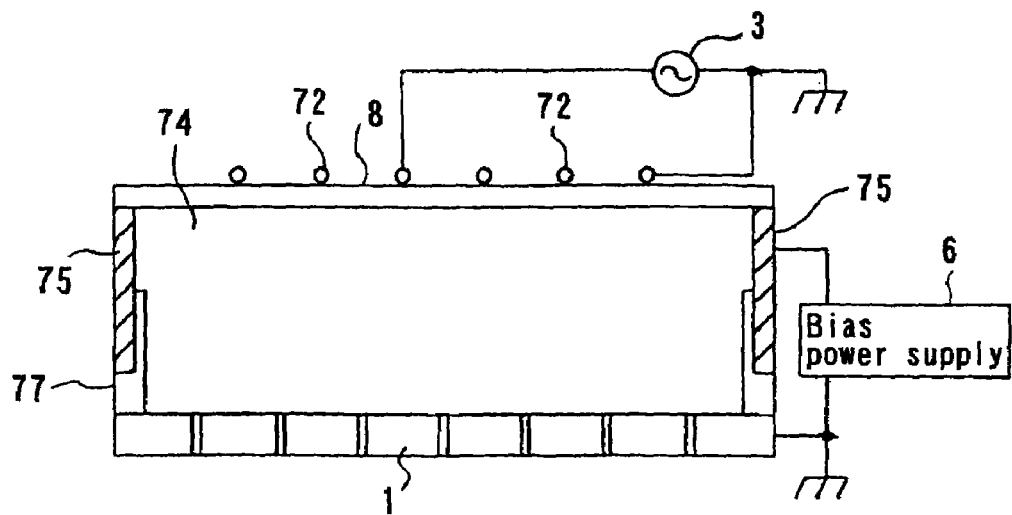
FIG. 8 is a cross-sectional view schematically showing a beam source according to an eight embodiment of the present invention.

FIG. 8 is a schematic view showing a beam source according to an eighth embodiment of the present invention. As shown in FIG. 8, the beam source has a cylindrical plasma generating chamber 74, a first electrode 1 disposed at a lower end of the plasma generating chamber 74, and an antenna 72 disposed outside of the plasma generating chamber 74 for generating plasma in the plasma generating chamber 74.

The plasma generating chamber 74 is formed by a lower cylindrical wall 77 and an upper cylindrical wall 75 disposed so as to face the first electrode 1. The upper cylindrical wall 75 is made of an electrically conductive material such as graphite or metal. For example, the upper cylindrical wall 75 is formed into a ring shape. The lower cylindrical wall 77 located between the upper cylindrical wall 75 and the first electrode 1 is made of an insulation material. Thus, the upper cylindrical wall 75 serves as a second electrode. The lower cylindrical wall 77 has a dielectric portion to generate plasma in the plasma generating chamber 74 by supplying a high-frequency current to the antenna 72.

The plasma generating chamber 74 has a gas inlet port (not shown) for introducing a gas into the plasma generating chamber 74. The gas inlet port is connected through a gas supply pipe (not shown) to a gas supply source (not shown), which supplies a gas such as $SF_6$, $CHF_3$, $CF_4$, $Cl_2$, Ar, $O_2$, $N_2$, and $C_4F_8$ into the plasma generating chamber 74.

The first electrode 1 is formed by an orifice plate (orifice electrode) made of an electrically conductive material such as graphite and electrically grounded. The orifice electrode 1 has a large number of orifices formed therein. The orifice electrode 1 serves as a first electrode and also serves as a neutralization device for beam particles.

The beam source is connected via the first electrode (orifice electrode) 1 to a vacuum chamber (not shown), which is evacuated by a vacuum pump (not shown) connected to the vacuum chamber. The pressure in the plasma generating chamber 74 is determined mainly by displacement of the vacuum pump, conductance of the orifice electrode 1, and types and a flow rate of gas supplied to the plasma generating chamber 74. The gas supplied may comprise a plurality of types of gas.

The antenna 72 is formed by a looped conductive material or a spiral elongated conductive material. The antenna 72 is connected via a matching box (not shown) to a high-frequency power supply 3, which applies a high-frequency voltage having a frequency of, for example, about 13.56

MHz, to the antenna 72. When a high-frequency current is supplied from the high-frequency power supply 3 via the matching box to the antenna 72, an induced magnetic field is produced through a dielectric window 8 in the plasma generating chamber 74 by the antenna 72. The varying magnetic field induces an electric field, which accelerates electrons to generate plasma in the plasma generating chamber 74. Thus, the antenna 72, the matching box, and the high-frequency power supply 3 form a plasma generator for generating plasma in the plasma generating chamber 74. As described above, by changing the methods of supplying a high-frequency voltage from the high-frequency power supply 3, it is possible to generate two types of plasma including plasma mainly composed of positive ions and heated electrons and plasma in which positive ions and negative ions coexist. The antenna 72 may include a water-cooled pipe for cooling the antenna 72.

The second electrode 75 is made of an electrically conductive material such as graphite and connected to a bias power supply 6, which applies a bias voltage between the first electrode 1 and the second electrode 75 to extract a beam from the plasma generated by the antenna 72. Positive ions or negative ions are accelerated and extracted as a neutral particle beam in the same manner as described above. As described in the seventh embodiment, it is possible to generate uniform plasma having a large diameter and to extract a neutral particle beam from the plasma at the same time.

Figure 9A:
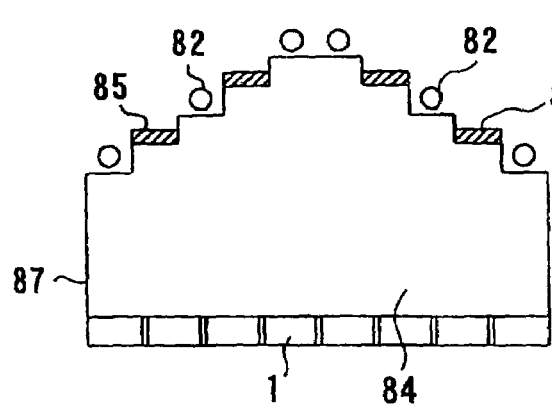
FIG. 9A is a cross-sectional view schematically showing a beam source according to a ninth embodiment of the present invention.

FIG. 9A is a schematic view showing a beam source according to a ninth embodiment of the present invention. As shown in FIG. 9A, the beam source has a plasma generating chamber 84, a first electrode 1 disposed at a lower end of the plasma generating chamber 84, antennas 82 disposed outside of the plasma generating chamber 84, a plurality of second electrodes 85 disposed within the plasma generating chamber 84 so as to face the first electrode 1.

The plasma generating chamber 84 is formed by a container 87 including a plurality of cylinders having different diameters so as to have a stepped top. The materials of the container 87 and the first electrode 1, the introduction of a gas into the plasma generating chamber 84, types of a gas, electric potentials and functions of the first electrode 1, evacuation of the plasma generating chamber 84, and determination of the pressure of the plasma generating chamber 84 are the same as described in the above embodiments. The antennas 82 are formed by, for example, a single looped conductive material or a plurality of looped conductive materials connected in parallel to each other.

The second electrodes 85 are made of an electrically conductive material such as graphite. In FIG. 9A, the second electrodes 85 are formed by a plurality of flat annular plates disposed between the antennas 82 on a ceiling of the plasma generating chamber 84. The second electrodes 85 are connected to a bias power supply, which applies a bias voltage between the first electrode 1 and the second electrodes 85 to extract a beam from the plasma generated by the antennas 82. The plasma is generated in the same manner as described above. Specifically, positive ions or negative ions are accelerated and extracted as a neutral particle beam in the same manner as described above. Since both of the antennas 82 and the second electrodes 85 are disposed so as to face the first electrode 1, it is possible to generate uniform plasma having a large diameter and to extract a neutral particle beam from the plasma at the same time.

Thus, a neutral particle beam can be extracted and applied to a workpiece so as to provide a beam source that does not cause any charge build-up phenomenon. Further, since the plasma generating chamber 84 where the plasma is generated is optically isolated from the workpiece by the first electrode (orifice electrode) 1, the radiation produced by the plasma is not substantially applied to the workpiece. Specifically, it is possible to provide a beam source that can prevent any damage from being caused to the workpiece by the charge build-up phenomenon or radiation.

Figure 9B:
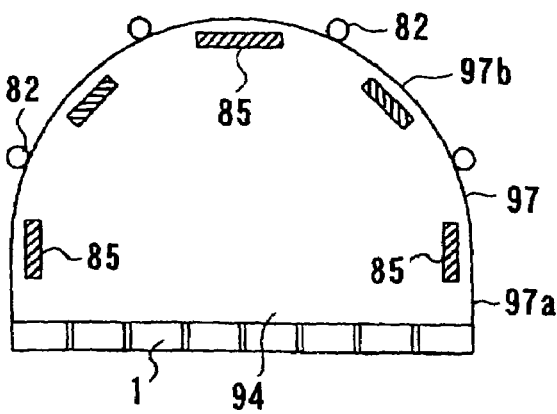
FIG. 9B is cross-sectional view schematically showing a variation of the beam source shown in FIG. 9A.

In this case, as shown in FIG. 9B, the beam source may have a plasma generating chamber 94 which is formed by a container 97 including a cylindrical portion 97a and a dome portion 97b. The dome portion 97b can provide more strength against pressures to the container 97 as compared to the stepped top shown in FIG. 9A. Accordingly, the container 97 can have a thinner wall. When the thickness of the wall of the container 97 is reduced, the manufacturing cost can be reduced, and loss of power to be supplied from the antennas 82 to the plasma is also reduced. Thus, the efficiency of the plasma generation is improved, and a beam can be extracted efficiently.

In the embodiments described above, positive ions or negative ions are extracted and neutralized into a neutral particle beam. However, instead of the orifice electrode used as the first electrode 1, a grid electrode made of an electrically conductive material in the form of a thin grid plate may be used as the first electrode 1. In such a case, positive ions or negative ions can be extracted and applied as a positive ion beam or a negative ion beam without neutralization.

In addition to the above embodiments, the shapes and locations of the antennas, the shapes of the plasma generating chamber, the shapes of the second electrode may be modified or varied so as to provide beam sources which can uniformly generate various kinds of beams having a large diameter, such as a positive ion beam, a negative ion beam, and a neutral particle beam. In this case, a proper beam source can be provided according to performance, manufacturing cost, and operation cost required for the beam source. Some possible variations of the above embodiments will be described below.

Figure 10A:
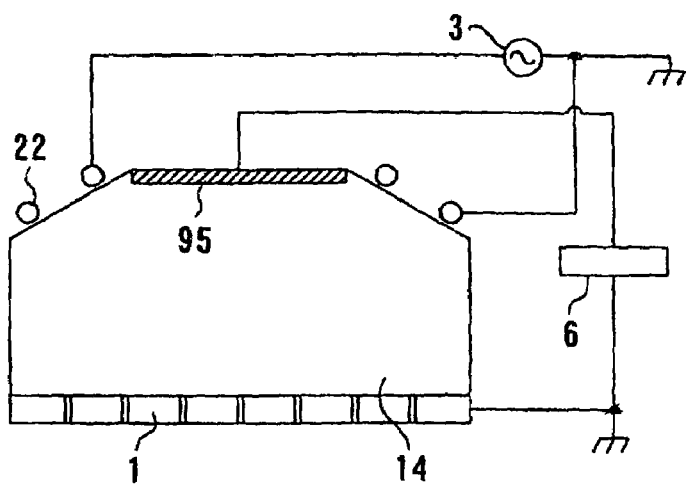
FIGS. 10A through 14 are views showing possible variations of a beam source according to the present invention.
Figure 10B:
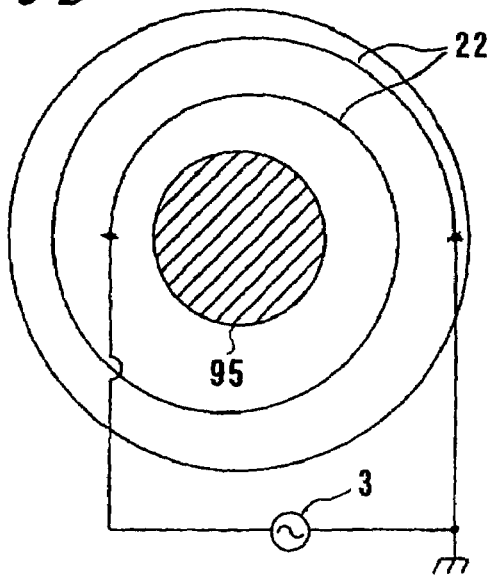

FIGS. 10A and 10B show a variation of a beam source according to the present invention. The beam source has a combination of a spiral antenna 22 as shown in FIG. 5B, a plasma generating chamber 14 formed by the cylindrical portion and the truncated conical portion as shown in FIG. 4A, and a second electrode 95 in the form of a flat circular plate.

Figure 11A:
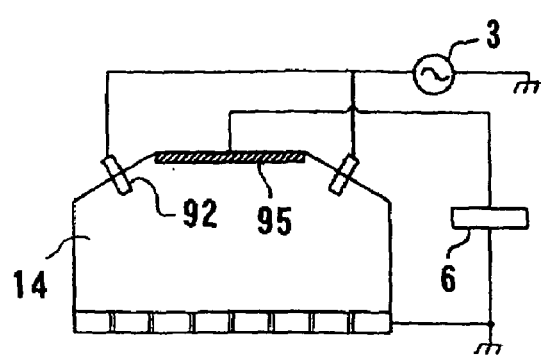
Figure 11B:
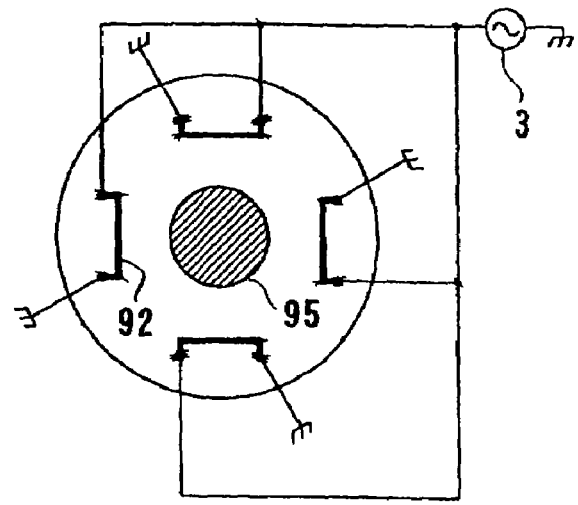
Figure 12A:
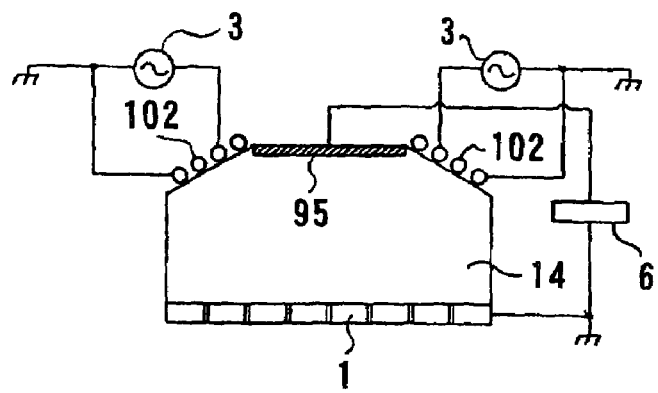
Figure 12B:
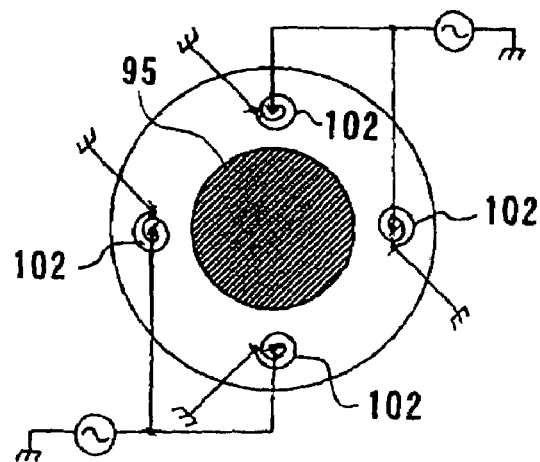

FIGS. 11A and 11B show another variation of a beam source according to the present invention. The beam source has a combination of internal antennas 92, a plasma generating chamber 14 formed by the cylindrical portion and the truncated conical portion as shown in FIG. 4A, and a second electrode 95 in the form of a flat circular plate. FIGS. 12A and 12B show another variation of a beam source according to the present invention. The beam source has a combination of a plurality of spiral antennas 102, a plasma generating chamber 14 formed by the cylindrical portion and the truncated conical portion as shown in FIG. 4A, and a second electrode 95 in the form of a flat circular plate. The beam source also includes two high-frequency power supplies 3 and 3, which apply high-frequency voltages to the plurality of spiral antennas 102 independently of each other. Thus, the plasma density can be controlled by the high-frequency power supplies 3 and 3. Accordingly, it is possible to produce more uniform plasma.

Figure 13A:
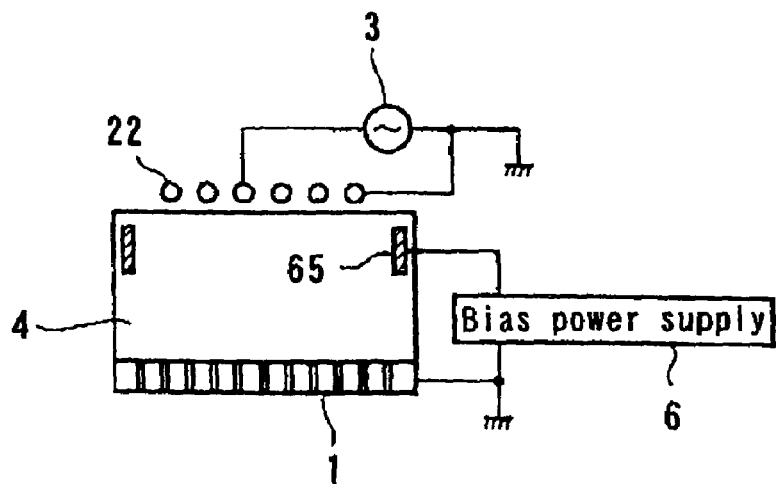
Figure 13B:
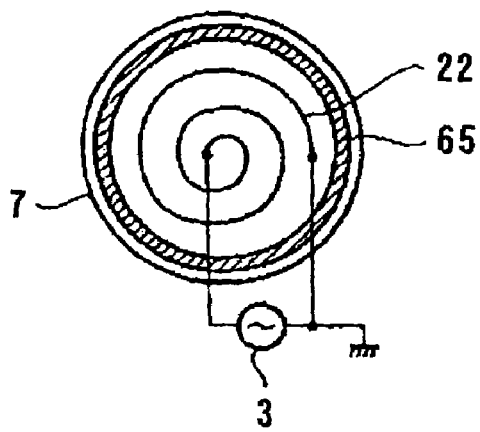
Figure 14:
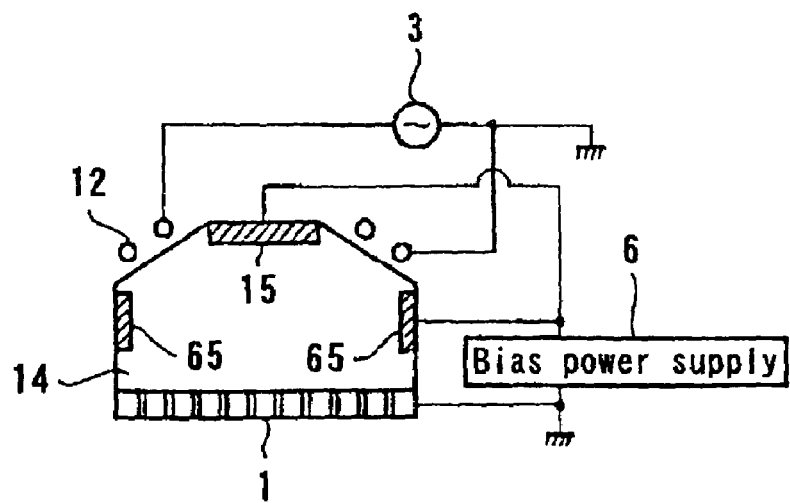

FIGS. 13A and 13B show another variation of a beam source according to the present invention. The beam source has a combination of a second electrode 65 having a ring shape as shown in FIG. 7A, a spiral antenna 22 as shown in FIG. 5B, and a cylindrical plasma generating chamber 4 as shown in FIG. 3A. As shown in FIG. 14, the second electrode 65 having a ring shape as shown in FIG. 7A may be added to the beam source shown in FIGS. 10A and 10B in order to improve uniformity of an extracted beam at a low plasma density.

FIG. 15 is a schematic view showing a beam processing apparatus using a beam source according to the present invention. The beam processing apparatus shown in FIG. 15 employs the beam source in the first embodiment shown in FIGS. 3A and 3B. Specifically, the beam source has the first electrode 1, the antennas 2, the high-frequency power supply 3, the plasma generating chamber 4, the second electrode 5, and the bias power supply 6. The beam source also has a gas inlet port (not shown) for introducing a gas into the plasma generating chamber 4, a gas supply pipe (not shown), and a gas supply source (not shown).

The beam processing apparatus has a vacuum chamber 130 disposed adjacent to the first electrode 1 so as to be positioned below the first electrode 1. The vacuum chamber 130 is connected to and evacuated by a vacuum pump 131. The pressure in the plasma generating chamber 4 is determined mainly by displacement of the vacuum pump 131, conductance of the first electrode 1, and types and a flow rate of gas supplied from the gas supply source to the plasma generating chamber 4. The gas supplied may comprise a plurality of types of gas. The beam processing apparatus includes a stage 132 for supporting a workpiece 133 thereon. Thus, the beam processing apparatus can apply a uniform beam having a large diameter from the beam source.

Since the beam source can apply a neutral particle beam to the workpiece 133, the workpiece 133 can be processed without any charge build-up phenomenon. Accordingly, it is possible to minimize defects caused by a charge build-up phenomenon, such as dielectric breakdowns caused to fine interconnections due to static electricity. Thus, it is possible to remarkably improve a yield of workpieces. Further, a radiation produced by plasma can be shielded from being applied to the workpiece 133 by the first electrode 1. Therefore, it is possible to minimize defects caused by the radiation and thus remarkably improve a yield of workpieces.

The stage 132 may be moved rotationally or linearly relative to the first electrode 1. When the stage 32 is properly moved relative to the first electrode 1 while a uniform beam is applied from the beam source, the workpiece 133 can be uniformly processed at a high processing rate over the entire surface thereof.

Thus, with the beam processing apparatus according to the present invention, various kinds of beams having a large diameter, such as a positive ion beam, a negative ion beam, and a neutral particle beam, can be applied uniformly to a workpiece. Further, the beam processing apparatus according to the present invention causes no charge build-up phenomenon and can shield a radiation from the plasma. Thus, it is possible to provide a beam processing apparatus that causes no damage to a workpiece.

As described above, according to the present invention, various kinds of beams having a large diameter, such as a positive ion beam, a negative ion beam, and a neutral particle beam, can be applied uniformly to a workpiece. Further, it is possible to provide a beam source and a beam processing apparatus that causes no charge build-up phenomenon on a workpiece or no damage to a workpiece.

Although certain preferred embodiments of the present invention have been shown and described in detail, it should be understood that various changes and modifications may be made therein without departing from the scope of the appended claims.

What is claimed is:

1. A beam source comprising:
    a plasma generating chamber;
    a first electrode disposed in said plasma generating chamber;
    an antenna disposed in said plasma generating chamber so as to face said first electrode for generating plasma in said plasma generating chamber;
    a second electrode disposed in said plasma generating chamber so as to face said first electrode; and
    a power supply for applying a voltage between said first electrode and said second electrode to extract ions from the plasma generated by said antenna.

2. The beam source as recited in claim 1, wherein said antenna has a spiral shape, wherein said second electrode has a spiral shape positioned between adjacent spiral lines of said spiral shape of said antenna.

3. The beam source as recited in claim 1, wherein said antenna comprises a plurality of divided antennas, wherein said second electrode comprises a plurality of divided second electrodes positioned between adjacent divided antennas.

4. The beam source as recited in claim 1, wherein said first electrode comprises an orifice plate having a plurality of orifices for neutralizing the ions extracted from the plasma.

5. The beam source as recited in claim 1, wherein said antenna includes a conductive material and an insulation member covering said conductive material.

6. The beam source as recited in claim 1, wherein said antenna comprises at least one looped conductive material.

7. The beam source as recited in claim 1, wherein said antenna comprises at least one elongated conductive material.

8. The beam source as recited in claim 7, wherein said at least one elongated conductive material has a hooked shape or an arcuate shape.

9. A beam source comprising:
    a plasma generating chamber;
    a first electrode disposed in said plasma generating chamber;
    an antenna disposed so as to face said first electrode for generating plasma in said plasma generating chamber;
    a second electrode disposed between said antenna and said first electrode in said plasma generating chamber, said second electrode having a ring shape so as to surround said plasma generating chamber; and
    a power supply for applying a voltage between said first electrode and said second electrode to extract ions from the plasma generated by said antenna.

10. The beam source as recited in claim 9, further comprising a container for defining said plasma generating chamber, said container having a wall which serves as said second electrode.

11. The beam source as recited in claim 9, wherein said first electrode comprises an orifice plate having a plurality of orifices for neutralizing the ions extracted from the plasma.

12. The beam source as recited in claim 9, wherein said second electrode is disposed at a peripheral portion of said plasma generating chamber.

13. The beam source as recited in claim 12, wherein said antenna has a spiral elongated conductive material.

14. A beam processing apparatus comprising:
a stage for supporting a workpiece; and
a beam source for applying a beam to the workpiece supported by said stage, said beam source comprising:
a plasma generating chamber;
a first electrode disposed in said plasma generating chamber;
an antenna disposed in said plasma generating chamber so as to face said first electrode for generating plasma in said plasma generating chamber;
a second electrode disposed in said plasma generating chamber so as to face said first electrode; and
a power supply for applying a voltage between said first electrode and said second electrode to extract ions from the plasma generated by said antenna.

15. The beam processing apparatus as recited in claim 14, wherein said antenna has a spiral shape, wherein said second electrode has a spiral shape positioned between adjacent spiral lines of said spiral shape of said antenna.

16. The beam processing apparatus as recited in claim 14, wherein said antenna comprises a plurality of divided antennas, wherein said second electrode comprises a plurality of divided second electrodes positioned between adjacent divided antennas.

17. The beam processing apparatus as recited in claim 14, wherein said first electrode comprises an orifice plate having a plurality of orifices for neutralizing the ions extracted from the plasma.

18. The beam processing apparatus as recited in claim 14, wherein said antenna includes a conductive material and an insulation member covering said conductive material.

19. The beam processing apparatus as recited in claim 14, wherein said antenna comprises at least one looped conductive material.

20. The beam processing apparatus as recited in claim 14, wherein said antenna comprises at least one elongated conductive material.

21. The beam processing apparatus as recited in claim 20, wherein said at least one elongated conductive material has a hooked shape or an arcuate shape.

22. A beam processing apparatus comprising:
a stage for supporting a workpiece; and
a beam source for applying a beam to the workpiece supported by said stage, said beam source comprising:
a plasma generating chamber;
a first electrode disposed in said plasma generating chamber;
an antenna disposed so as to face said first electrode for generating plasma in said plasma generating chamber;
a second electrode disposed between said antenna and said first electrode in said plasma generating chamber,
said second electrode having a ring shape so as to surround said plasma generating chamber; and
a power supply for applying a voltage between said first electrode and said second electrode to extract ions from the plasma generated by said antenna.

23. The beam processing apparatus as recited in claim 22, wherein said beam source comprises a container for defining said plasma generating chamber, said container having a wall which serves as said second electrode.

24. The beam processing apparatus as recited in claim 22, wherein said first electrode comprises an orifice plate having a plurality of orifices for neutralizing the ions extracted from the plasma.

25. The beam processing apparatus as recited in claim 22, wherein said second electrode is disposed at a peripheral portion of said plasma generating chamber.

26. The beam processing apparatus as recited in claim 25, wherein said antenna has a spiral elongated conductive material.

* * * * *